(12) United States Patent
Kojima

(10) Patent No.: US 6,639,221 B2
(45) Date of Patent: Oct. 28, 2003

(54) ANNULAR ILLUMINATION METHOD FOR CHARGED PARTICLE PROJECTION OPTICS

(75) Inventor: Shinichi Kojima, Wappingers Falls, NY (US)

(73) Assignee: Nikon Corporation, Tokyo (JP)

(*) Notice: Subject to any disclaimer, the term of this patent is extended or adjusted under 35 U.S.C. 154(b) by 62 days.

(21) Appl. No.: 10/052,605

(22) Filed: Jan. 18, 2002

(65) Prior Publication Data
US 2003/0137314 A1 Jul. 24, 2003

(51) Int. Cl.[7] .............................. G01K 1/08; G21K 1/08; G21K 5/10
(52) U.S. Cl. .................. 250/397; 250/396 R; 250/398; 250/492.23
(58) Field of Search .................. 250/397, 396 R, 250/398, 491.1, 492.2, 492.3, 492.23

(56) References Cited

U.S. PATENT DOCUMENTS

| | | | | |
|---|---|---|---|---|
| 4,947,413 A | * | 8/1990 | Jewell et al. ............... 378/34 |
| 5,311,026 A | * | 5/1994 | Saitou et al. ............ 250/492.2 |
| 5,500,312 A | | 3/1996 | Harriot et al. ............... 430/5 |
| 5,663,568 A | * | 9/1997 | Waskiewicz ............ 250/492.2 |
| 5,821,542 A | | 10/1998 | Golladay ................ 250/396 R |
| 5,834,783 A | | 11/1998 | Muraki et al. ............. 250/398 |
| 5,973,332 A | | 10/1999 | Muraki et al. ........... 250/492.2 |
| 5,981,962 A | | 11/1999 | Groves et al. .......... 250/492.23 |
| 6,023,067 A | * | 2/2000 | Stickel et al. ........... 250/396 R |
| 6,087,669 A | * | 7/2000 | Suzuki .................. 250/492.23 |
| 6,326,633 B2 | * | 12/2001 | Nakasuji ................. 250/492.3 |
| 6,441,384 B1 | * | 8/2002 | Kojima .................. 250/492.23 |
| 6,472,672 B1 | * | 10/2002 | Muraki ................... 250/492.2 |
| 6,515,409 B2 | * | 2/2003 | Muraki et al. ............. 313/359.1 |

FOREIGN PATENT DOCUMENTS

| | | | |
|---|---|---|---|
| JP | 11-287610 | 10/1999 | .......... H01J/37/027 |
| JP | 2000-012454 | 1/2000 | .......... H01L/21/027 |
| JP | 2000-100891 | 4/2000 | .......... H01L/21/027 |

OTHER PUBLICATIONS

Pfeiffer et al. "Projection reduction exposure with variable axis immersion lenses: Next generation lithography", J. Vac. Sci. Technol., B 17(6), pp. 1–7 (Nov./Dec. 1999).

* cited by examiner

Primary Examiner—Andrew H. Hirshfeld
Assistant Examiner—Wasseem Hamdan
(74) Attorney, Agent, or Firm—Graham S. Jones, II

(57) ABSTRACT

A method and apparatus for aligning a charged particle beam with an aperture includes providing a hollow beam aperture device adapted for shaping a charged particle beam into a hollow charged particle beam. Then direct the charged particle beam through the aperture. Provide deflection coils for deflecting the charged particle beam relative to the aperture. Vary the current to the alignment deflection coils while measuring the aperture electrical current generated by charged particles reaching the hollow beam aperture as a function of the current to the alignment deflection coils. Then adjust the current in the alignment deflection coils based on the aperture electrical current to center the charged particle beam on the hollow beam aperture. Preferably, separate hollow beam and peripheral beam apertures with associated sensing and current are used to center the beam on respective ones of the apertures.

28 Claims, 11 Drawing Sheets

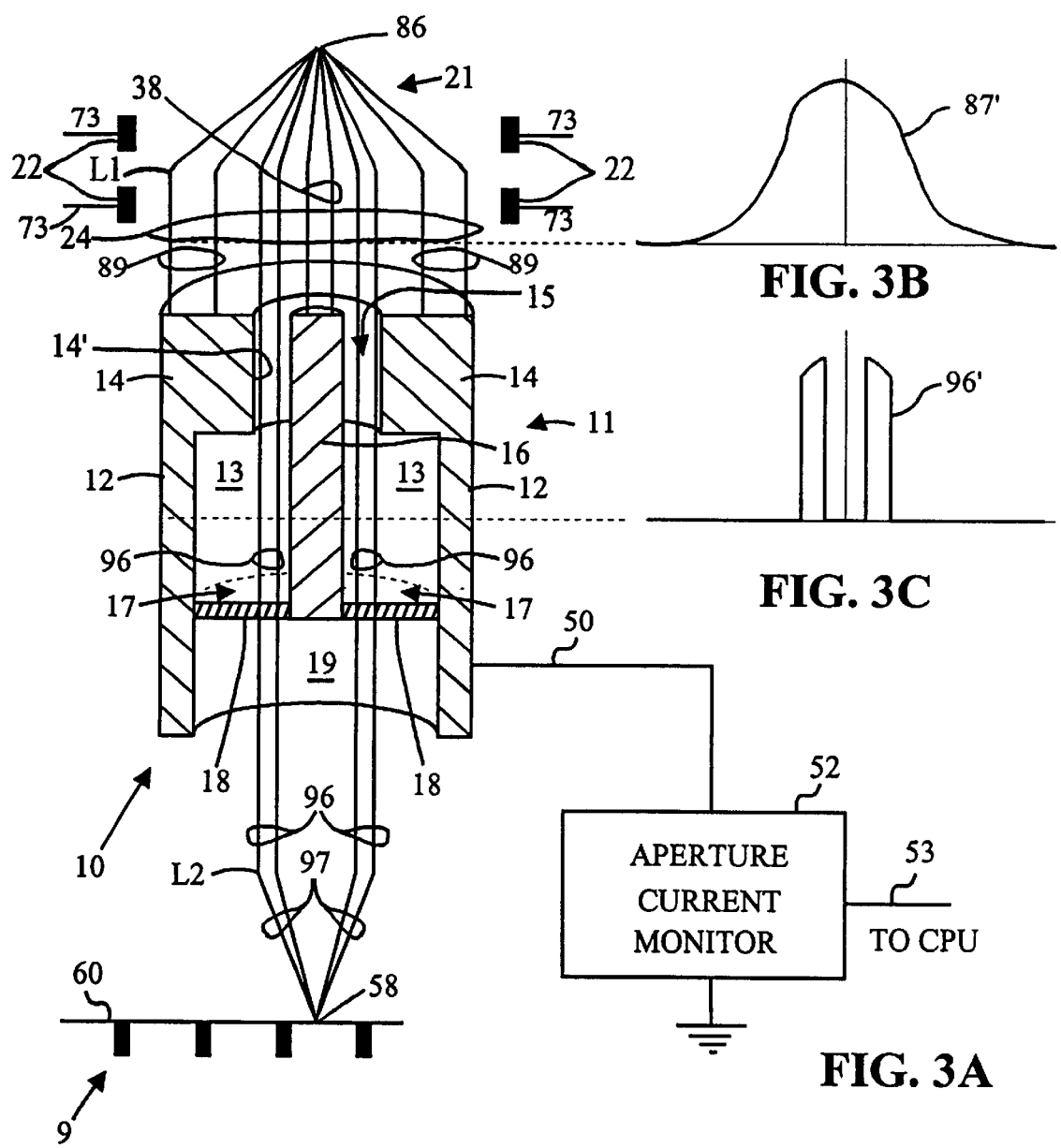
FIG. 3B
FIG. 3C
FIG. 3A
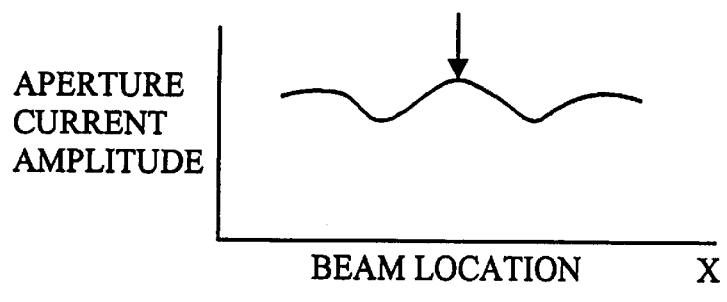
FIG. 4

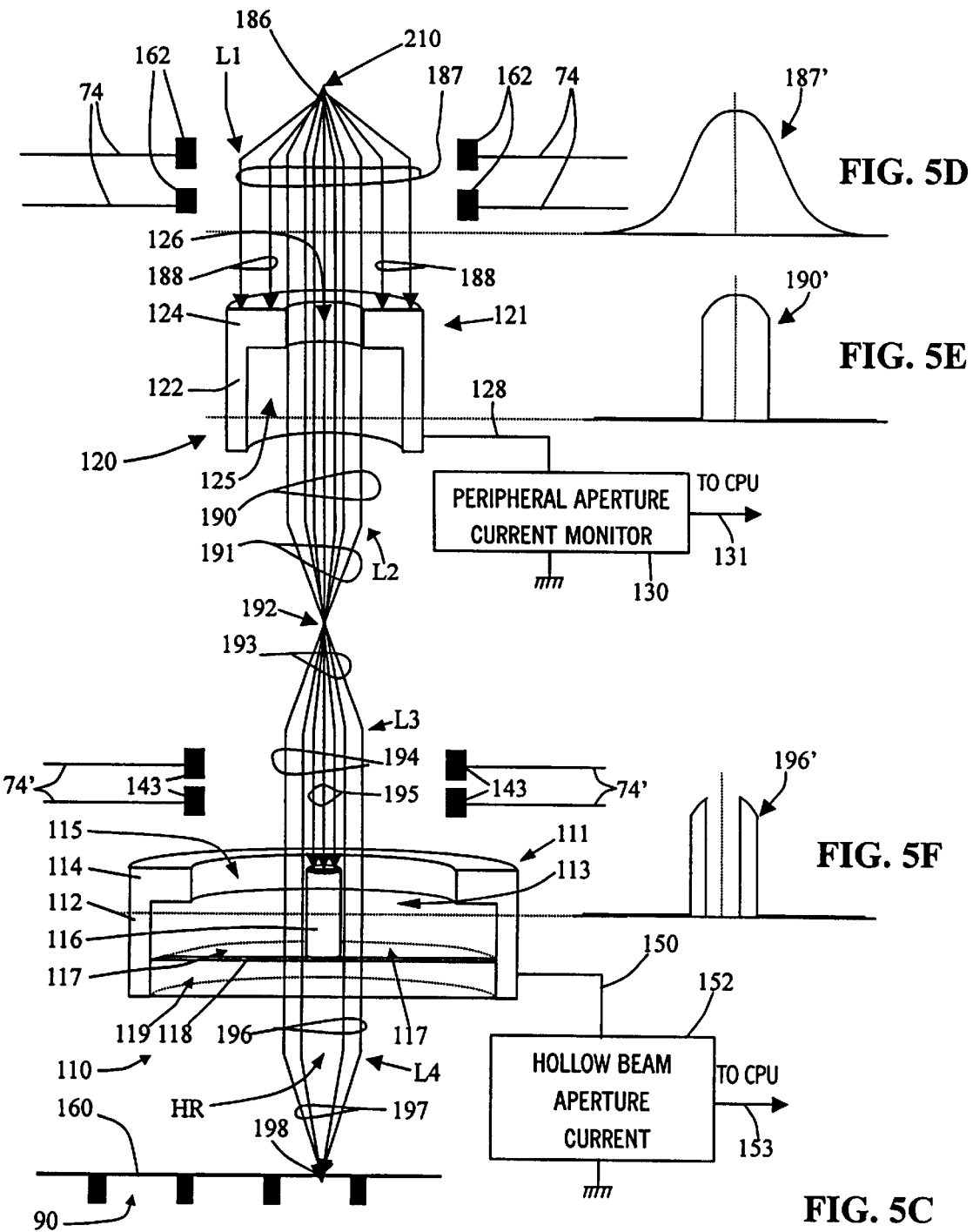

ANNULAR ILLUMINATION METHOD FOR CHARGED PARTICLE PROJECTION OPTICS

BACKGROUND OF THE INVENTION

1. Field of the Invention

This invention relates to particle imaging systems and more particularly to methods and apparatus for alignment of charged particle beam projection lithography systems.

2. Description of Related Art

A problem with using charged particle projection optics has been the adverse effects of space charge upon beam projection optics. To ameliorate such effects by enhancing charged particle projection optics, hollow beam annular illumination technology is being developed because hollow beam annular illumination technology can suppress space charge effects dramatically. Hollow beam annular illumination with its reduced space charge problems, permits high throughput charged particle lithography equipment to be produced, because with a hollow beam even a projection system which employs a high beam current can produce well focussed images.

U.S. Pat. No. 5,821,542 of Golladay for "Particle Beam Imaging System Having Hollow Beam Illumination" states that "throughput is significantly lower for e-beam exposure systems than for photoexposure systems, thus making e-beam tools too costly for general production." The Golladay patent states further "Higher throughput in e-beam lithography systems can presently be achieved by increasing the e-beam current, but only with an unacceptable degradation in resolution. The degradation in resolution can be attributed to interactions between electrons within the electron beam. The natural repulsion between electrons, due to having charges of the same polarity, causes a number of deleterious effects which limit resolution at the workpiece . . . " To overcome the above stated problem the Golladay patent describes a charged particle beam imaging system in which an annular aperture comprises a central circular area which is substantially non-transmissive to a beam of charged particles and a first ring shaped area which is substantially transmissive to the beam of charged particles surrounded by a second ring-shaped area which is substantially non-transmissive to the beam.

U.S. Pat. No. 5,834,783 of Muraki et al. for "Electron Beam Exposure Apparatus and Method and Device Manufacturing Method" and U.S. Pat. No. 5,973,332 of Muraki et al. for "Electron Beam Exposure Method, and Device Manufacturing Method Using Same" describe an E-beam exposure apparatus including a "hollow beam forming stop whose central portion is shielded . . . " Muraki et al. states "Since the space charge effect of hollow electron beam (hollow cylindrical beam) is smaller than that of a nonhollow electron beam (e.g. a Gaussian beam), the electron beam can be brought to focus on the wafer to form a source image free from any blur on the wafer . . . the electron density at the peripheral portion becomes higher than that at the central portion."

As is discussed below in more detail, even with the above described advantages of hollow beam systems, there are problems with alignment of the charged particle beam with the apertures which define the configuration of the hollow beam.

SUMMARY OF THE INVENTION

A method and apparatus for aligning a charged particle beam with an aperture includes providing a hollow beam aperture means adapted for shaping a charged particle beam into a hollow charged particle beam. Then direct the charged particle beam through the aperture. Provide deflection coils for deflecting the charged particle beam relative to the aperture. Vary the current to the alignment deflection coils while measuring the aperture electrical current generated by charged particles reaching the hollow beam aperture as a function of the current to the alignment deflection coils. Then adjust the current in the alignment deflection coils based on the aperture electrical current measured to center the charged particle beam on the hollow beam aperture. Preferably, separate hollow beam and peripheral beam apertures with associated sensing and current are used to center the beam on respective ones of the apertures.

BRIEF DESCRIPTION OF THE DRAWINGS

The foregoing and other aspects and advantages of this invention are explained and described below with reference to the accompanying drawings, in which:

FIG. 3A shows a perspective view similar to FIG. 1C of an E-beam exposure system with the E-beam directed onto a composite aperture with a hollow beam directed onto a reticle.

FIG. 3B shows a beam intensity distribution of a collimated E-beam entering the composite aperture of FIG. 3A.

FIG. 3C shows a beam intensity distribution of scan of a collimated hollow E-beam leaving the composite aperture of FIG. 3A.

FIG. 4 is a graph showing an example of monitored aperture current amplitude of the hollow E-beam method of FIG. 3A which is less than the exemplary result desired.

FIG. 5C shows additional details of the embodiment of FIG. 5A.

FIG. 5D is a graph which shows an example of a bell shaped curve of current in upper E-beam of FIGS. 5A and 5C.

FIG. 5E is a graph which shows an example of the narrowed aperture current profile of the intermediate E-beam monitored inside the hollow cylinder in the lower portion of the upper aperture of FIGS. 5A and 5C.

FIG. 5F is a graph that shows the hollow E-beam profile of the lower aperture current of E-beam monitored in the lower aperture in FIGS. 5A and 5C.

DESCRIPTION OF THE PREFERRED EMBODIMENT

Figure 1A:
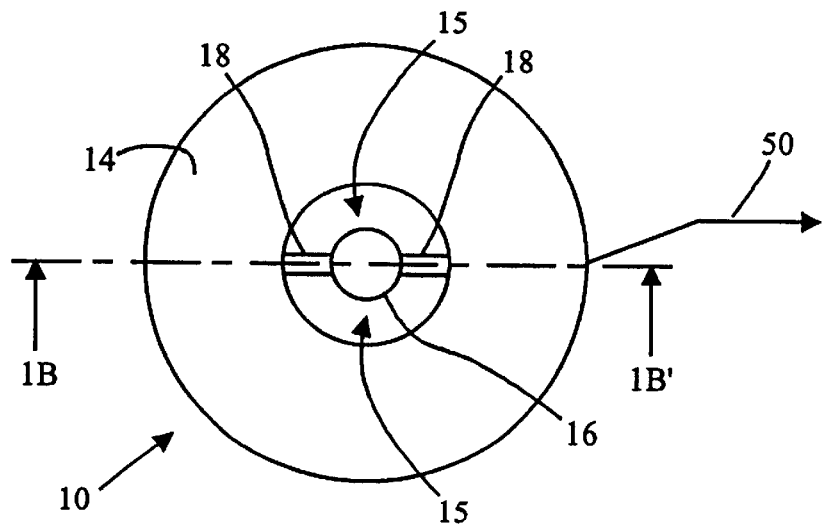
FIG. 1A is a top view of a cylindrically shaped composite peripheral and hollow beam aperture for an E-beam projection system for shaping an E-beam in accordance with this invention.
Figure 1B:
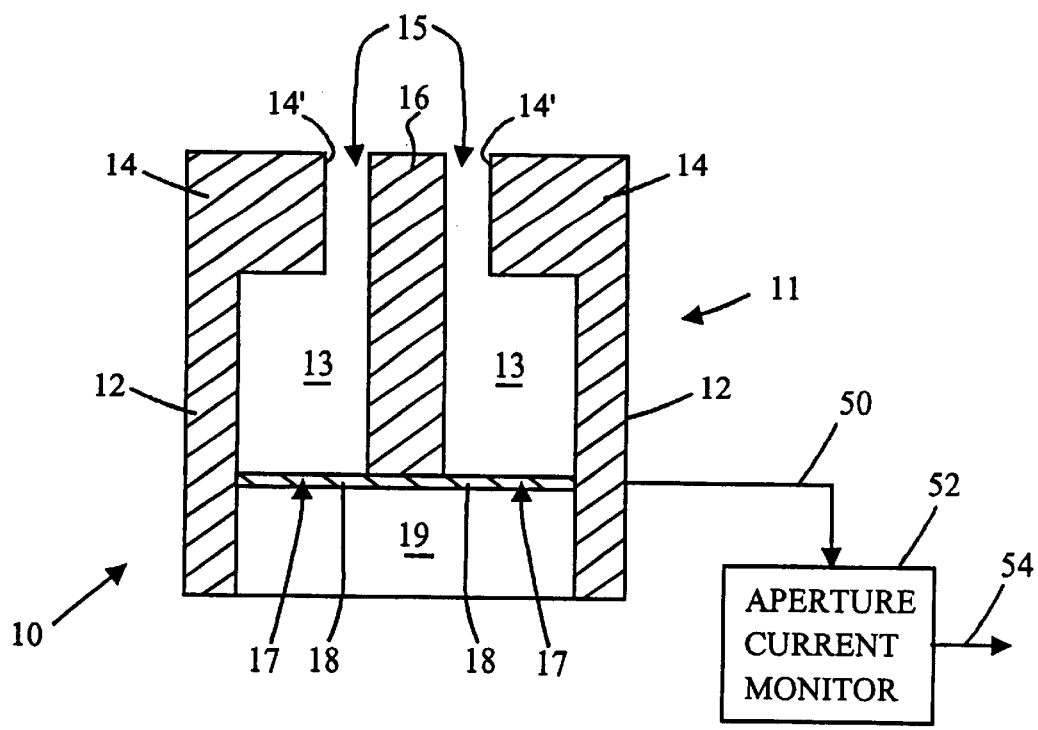
FIG. 1B is a sectional view taken along line 1B—1B' in FIG. 1A of the composite peripheral and hollow beam aperture of FIG. 1A.
Figure 1C:
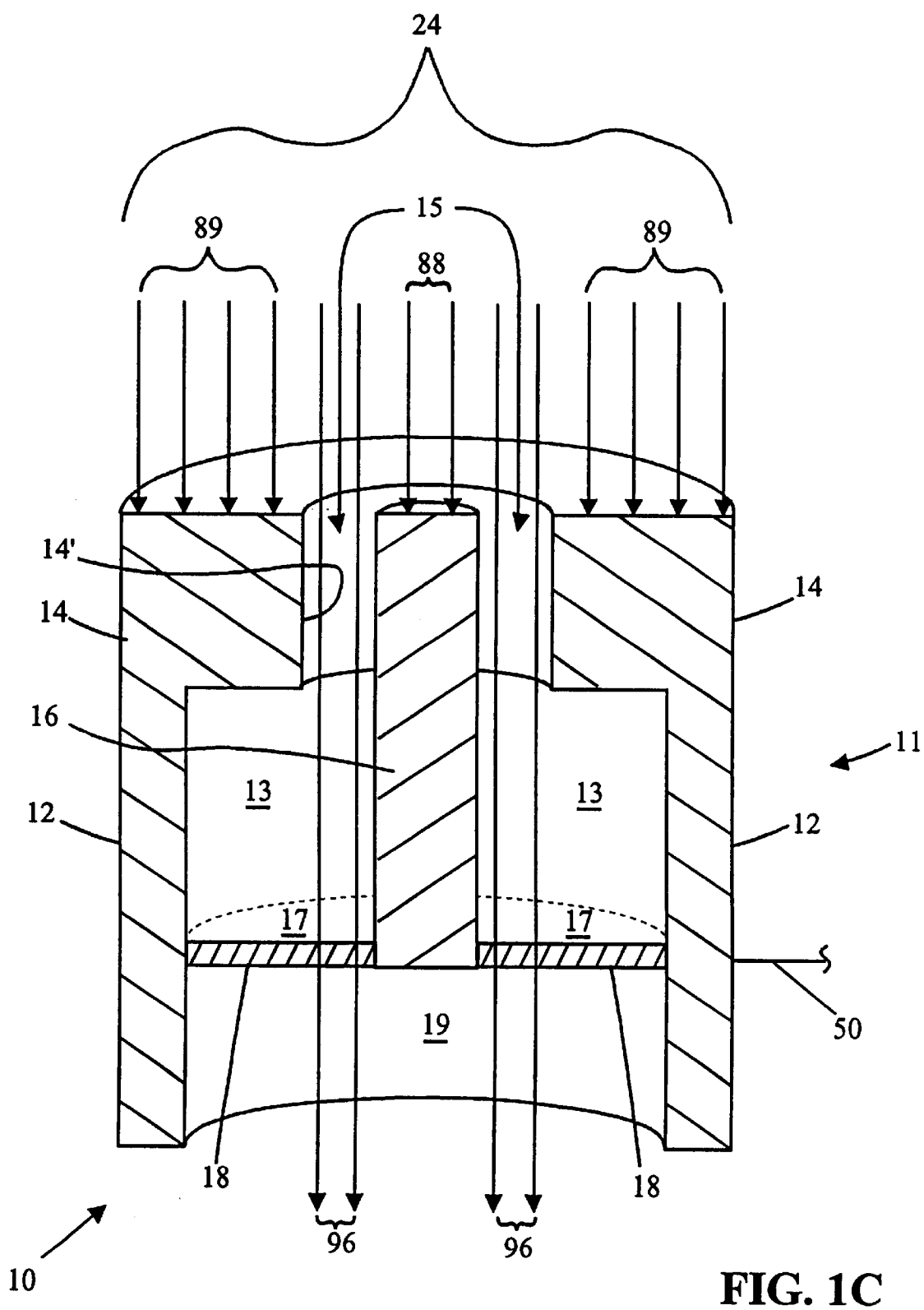
FIG. 1C is a perspective sectional view, taken along line 1B—1B' in FIG. 1A, of the composite peripheral and hollow beam aperture of FIG. 1A, showing an E-beam directed onto and through the aperture.

FIGS. 1A–1C show various views of a composite peripheral and hollow electron beam annular aperture 10 for shaping an E-beam 24 into a hollow E-beam 96/97 for illumination (E-beam exposure) of a target comprising workpiece 60, shown in FIG. 3A which is shown as a reticle.

FIG. 1A is a top view of the cylindrically-shaped, electrically-conductive-metallic, composite peripheral-and-hollow E-beam aperture 10 connected to an electrical circuit through electrical output line 50.

FIG. 1B is a sectional view taken along line 1B—1B' in FIG. 1A through the central axis of the composite peripheral and hollow E-beam aperture 10.

FIG. 1C is a perspective sectional view of the composite peripheral and hollow E-beam aperture 10 taken along line 1B—1B' in FIG. 1A with a collimated E-beam 24 projected directed onto the top 14 thereof. The collimated E-beam 24 has passed from a conventional E-beam source (not shown for convenience of illustration) through a first crossover and through a first lens L1 which collimates the collimated E-beam 24.

The composite aperture 10 acts as a mask blocking both the periphery of the collimated beam 24 and the center of collimated E-beam 24 thereby shaping/patterning the collimated E-beam 24 into a hollow E-beam 96 which passes through the composite aperture 10 and out of the bottom thereof and through lens L2 which focuses collimated E-beam 24 as an E-beam 97 onto a spot 58 on a workpiece 60 shown in FIG. 3A.

Composite aperture 10 comprises an electrically-conductive-metallic shell 11 comprising a hollow metallic cylinder 12 open on the bottom and covered by a metallic top 14 which has a coaxial, circular, central hole 14' therethrough. Aperture 10 also includes an electrically-conductive-metallic center pole 16 that is suspended coaxially with and inside cylinder 12 and top 14.

The upper end of center pole 16 is located inside central hole 14' aligned coaxially therewith. An annular passageway for the hollow E-beam 96 is provided by the combination of the center pole 16 and the wall of central hole 14' since the center pole 16 is aligned coaxially with the cylinder 12 and the central hole 14'.

The hollow E-beam 96 passes between the walls of central hole 14' in top 14 and the pole 16. Inside the upper side-walls of the cylinder 12, below the top 14 and above a set of radial struts 18 is an upper space 13 through which the hollow E-beam 96 passes.

After hollow E-beam 96 passes through the upper space 13 it reaches a set of several openings 17 between the struts 18 and the E-beam passes through openings 17 into an lower space 19. In other words openings 17 provide interconnections between the upper space 13 and the lower space 19 inside the lower side-walls of the cylinder 12 allowing the hollow E-beam 96 to pass therethrough.

Then hollow E-beam 96 passes from lower space 19 out of cylinder 12 and through the lens L2 which focuses the collimated E-beam 24 into a converging hollow E-beam 97 that is focused onto a very small spot 58 on a workpiece (reticle) 60.

As indicated above, inside cylinder 12, there are the several, radially-disposed, conductive metallic struts 18, which are electrically and mechanically connected to cylinder 12. Struts 18 are provided to support the center pole 16 and to conduct electrons which are collected thereby towards the electrical output line 50. The struts 18 are secured to the inner wall of the lower end of cylinder 12 (well below the annular top 14) and they are firmly connected to the center pole 16 both mechanically and electrically. As can be seen in FIG. 1C, there are openings 17, between (aside from) the struts 18, through which only the hollow E-beam 96, which (as stated above) is a portion of collimated E-beam 24, can pass.

To summarize, the composite aperture 10 includes an annular, upper aperture 15 formed between the center pole 16 and the side walls of the central hole 14' in top 14. The hollow E-beam 96 passes through upper aperture 15; while the peripheral (outer) portion 89 of collimated E-beam 24 strikes the top 14 of shell 11 and is masked thereby and the electrons striking the top 14 cause some electrical current to flow through electrical output line 50. The central beam 88 which is the central portion of collimated E-beam 24, i.e. the interior portion thereof, strikes the center pole 16 and is masked thereby and adds some more electrons to the electrical current flowing through the electrical output line 50.

FIG. 3A shows a perspective view similar to FIG. 1C of an upper portion of an E-beam exposure system 9 with an E-beam 21 divergent from an upper crossover 86 directed through lens Li which produces a collimated E-beam 24 consisting of electrons travelling in parallel towards the surface of the top 14 of the shell 11 of the composite aperture 10. The hollow E-beam 96 which passes out of the composite aperture 10 is directed therefrom onto a point 58 on a workpiece (reticle) 60. Ideally, the collimated E-beam 24 is supposed to be centered on the top 14 and the center pole 16 of composite annular aperture 10.

Since the location (alignment) of the center pole 16 determines the shape and location of the hollow E-beam 96, it is crucial to align a charged particle beam 21 directed onto the top surface of the composite aperture 10 with a high degree of accuracy. As shown in FIG. 3A, when the hollow E-beam 96 leaves the composite aperture 10, it is focussed down by lens L2 onto the point 58 on the workpiece (reticle) 60.

A problem that arises is that the E-beam 21 may not be accurately centered on the composite aperture 10, which is a significant fact because of the extremely tight tolerances of submicron devices which means that accuracy of machining in forming and assembling the components of the annular aperture 10 is crucial. I have found that the problem of alignment of E-beam 21 is attributable to machining and assembly errors that affect the location of upper aperture 15 and center pole 16 in the composite aperture 10.

Figure 2A:
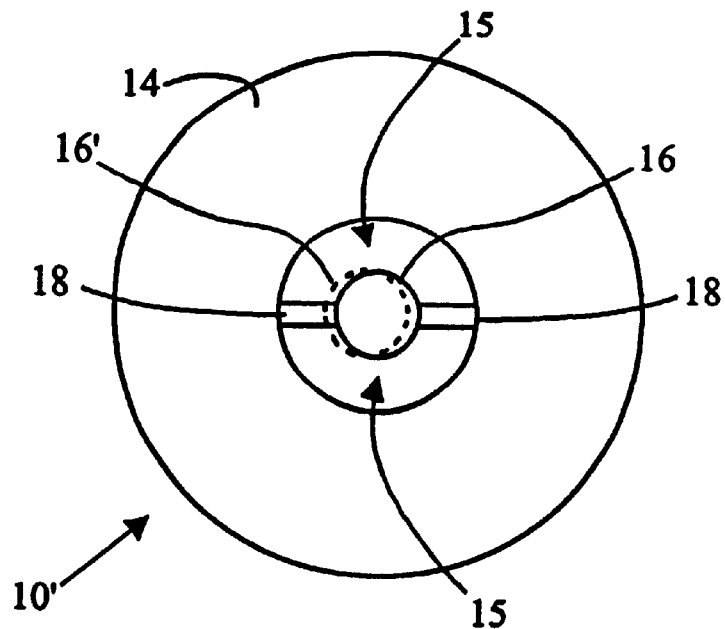
FIGS. 2A and 2B are similar views to those of the annular aperture in FIGS. 1A and 1B which show an example of a misaligned annular aperture with an alignment fabrication error.
Figure 2B:
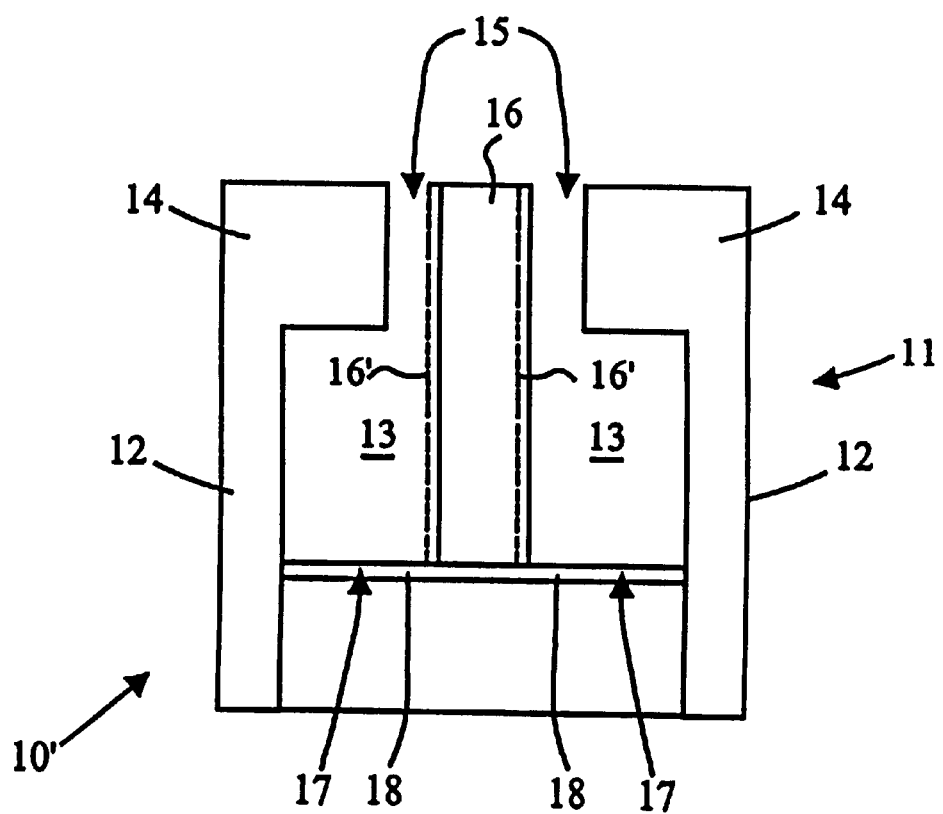

FIGS. 2A and 2B are similar views to those of composite aperture 10 in FIGS. 1A and 1B, which include phantom lines which show an example of a misaligned annular aperture 10' due to an alignment fabrication error in the positioning of the center pole 16. FIG. 2A shows a modified view of FIG. 1A that illustrates misalignment of the center pole 16' (in phantom) as contrasted to the properly aligned center pole 16. FIG. 2B is a sectional view modified based on FIG. 1B of a composite peripheral and hollow E-beam aperture 10' showing the center pole 16' (in phantom) and the properly aligned center pole 16.

FIGS. 2A and 2B illustrate the contrast between a misaligned center pole 16' (dotted lines) in the annular aperture 15, and a ideally aligned center pole 16 in the upper aperture 15. Cross-section lines have been omitted for clarity of illustration. In FIGS. 2A and 2B, in solid lines the center pole 16 is shown in the ideal position in which it is coaxial with the composite aperture 10. In contrast, a misaligned center pole 16', which is shown in phantom, will cause the hollow E-beam to have an asymmetric current distribution which makes it impossible to obtain a symmetrical E-beam current distribution.

Proper alignment of the center pole 16 is crucial to achievement of the result which is obtained when the charged particle beam 36, which is directed onto the composite aperture 10, is aligned with a specified degree of accuracy, since the center of the E-beam 36 must coincide with the central axis of the composite aperture 10 which is greatly affected by the geometry of the center pole 16/16' or other deviations from specifications. If the accuracy of alignment of the E-beam with the composite aperture 10 is not sufficient, the expected advantages of the hollow E-beam illumination method which is supposed to work against the problems caused by space charge effects will not be obtained or will be greatly suppressed.

Any asymmetry of the annular E-beam shape (more exactly saying, "beam current distribution") produces larger magnitudes of aberrations due to space charge effects than we would expect from an ideally shaped annular E-beam. Also, highly controlled E-beam positioning stability onto the composite aperture 10 is important. If proper alignment does not exist, then the beam current of the E-beam will vary with time, and a serious dose error will result.

FIRST EMBODIMENT OF THE INVENTION

Aperture Current Monitor

Referring again to FIG. 3A, to solve the above problem, I have designed a control method and a control system employing an aperture current monitor 52 which monitors current received by the composite aperture 10, including the metallic shell 11 and the center pole 16, via electrical output line 50 which connects the cylinder 14 to the aperture current monitor 52.

Figure 8A:
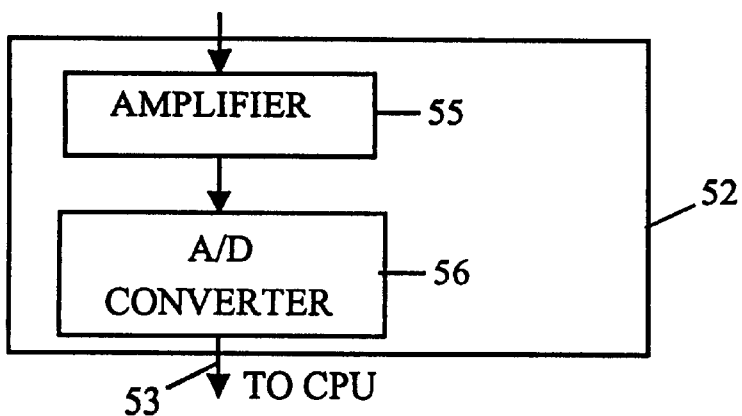
FIG. 8A shows an aperture current monitor which includes an amplifier and an A/D converter that provide an output signal to a computer system seen in FIG. 8B.
Figure 8B:
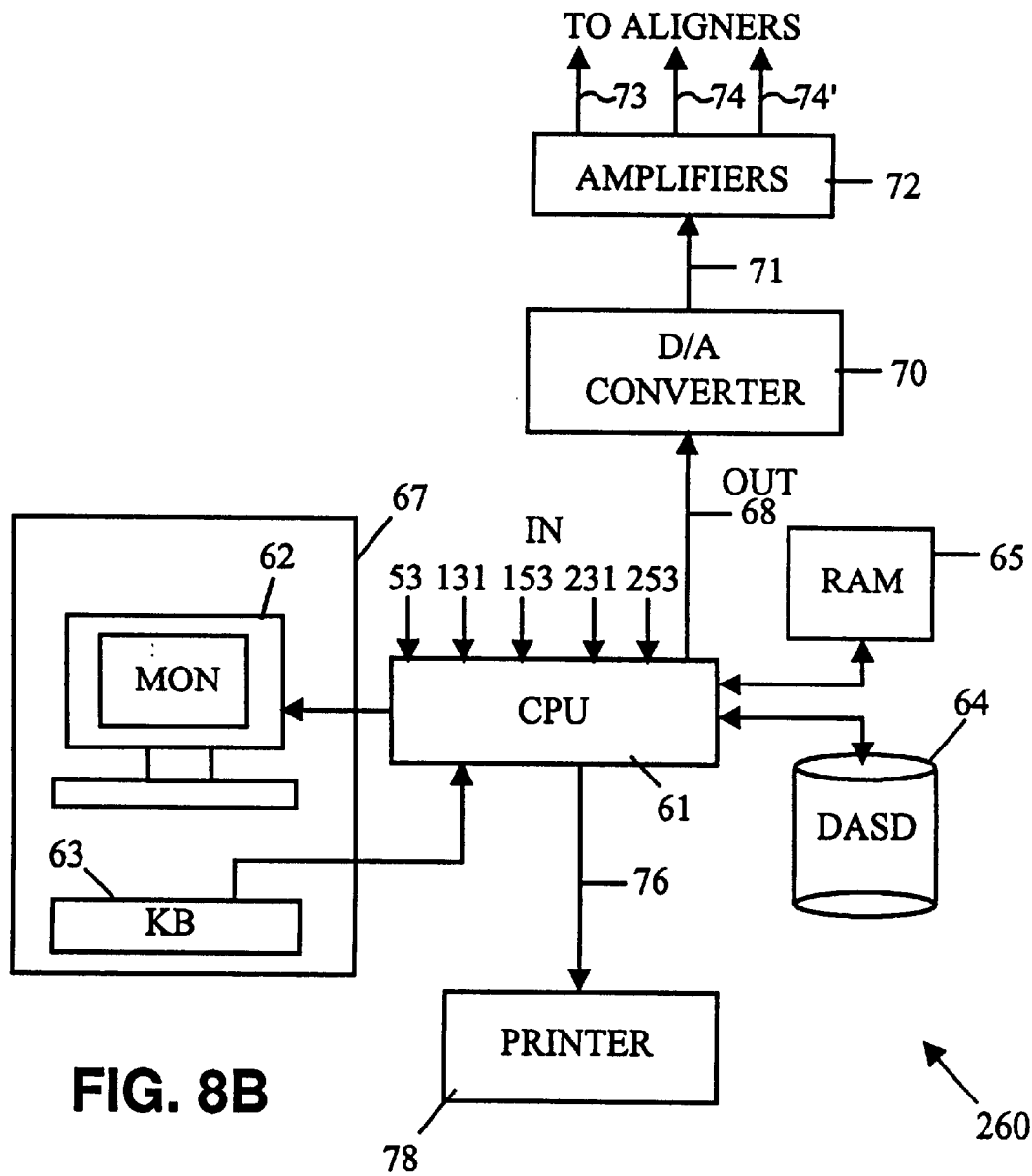
FIG. 8B shows a computer system for controlling adjustment of E-beam alignment and centering onto the apertures by varying the current to the aligners by varying of the current through the respective apertures in FIGS. 3A, 5A–5C as adjusted by varying the excitation current of the aligners in accordance with the algorithm in FIG. 10A.

FIG. 8A shows the aperture current monitor 52 that including amplifier 55 and an A/D converter 56 that provide an output signal on line 53 to the Central Processing Unit (CPU) of a computer system 260 seen in FIG. 8B.

Adjustment of Alignment

Associated with the aperture 10 there are alignment coils (upper aligners) 22 which control the E-beam position and the angle of the collimated E-beam 24. The upper aligners 22 make it possible to align and center the collimated E-beam 24 accurately onto the aperture 10 below it.

Figure 5A:
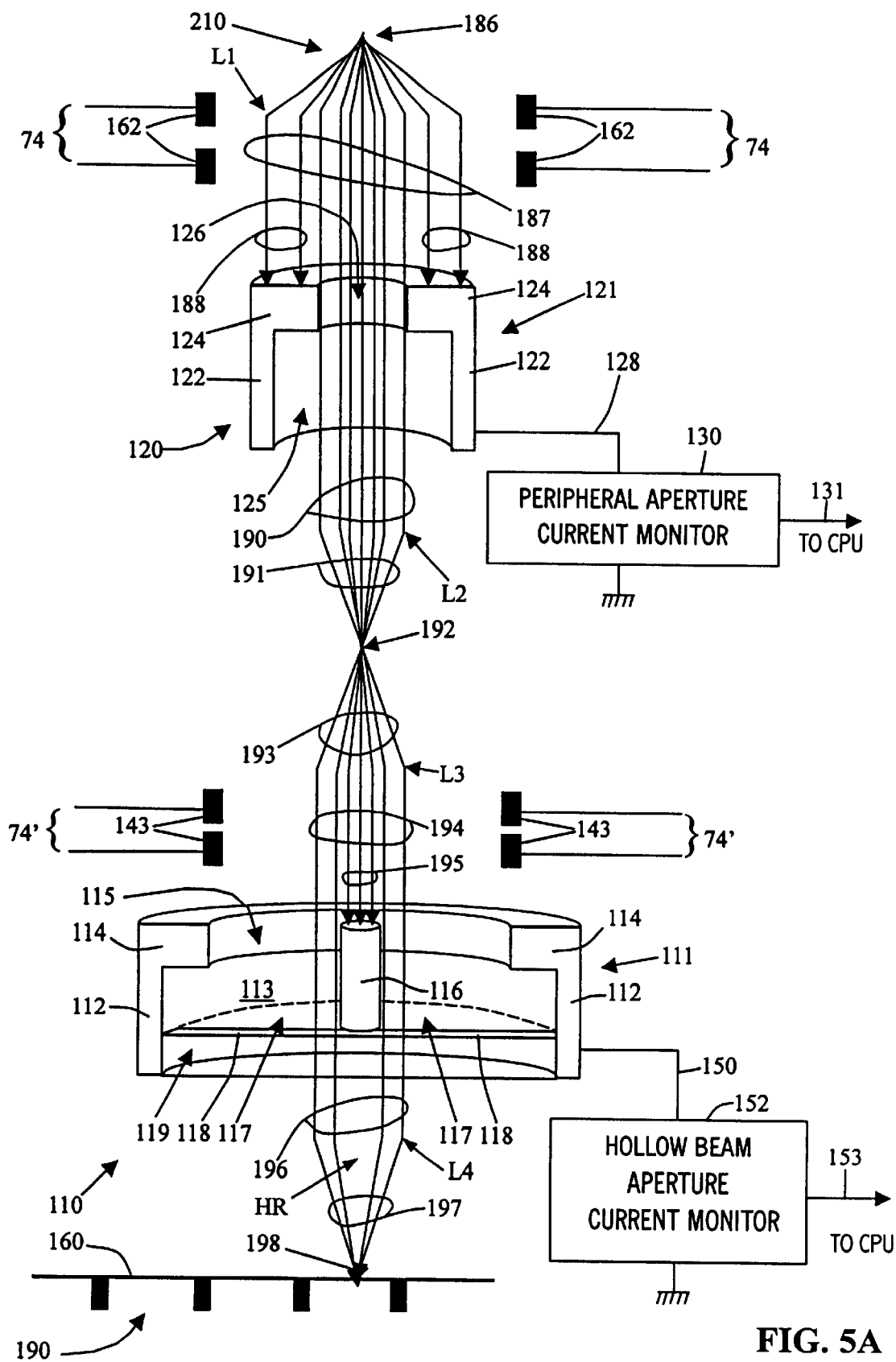
FIGS 5A and 5B show alternate dual aperture embodiments of several improved methods and apparatus, in accordance with this invention, which are described below.
Figure 10A:
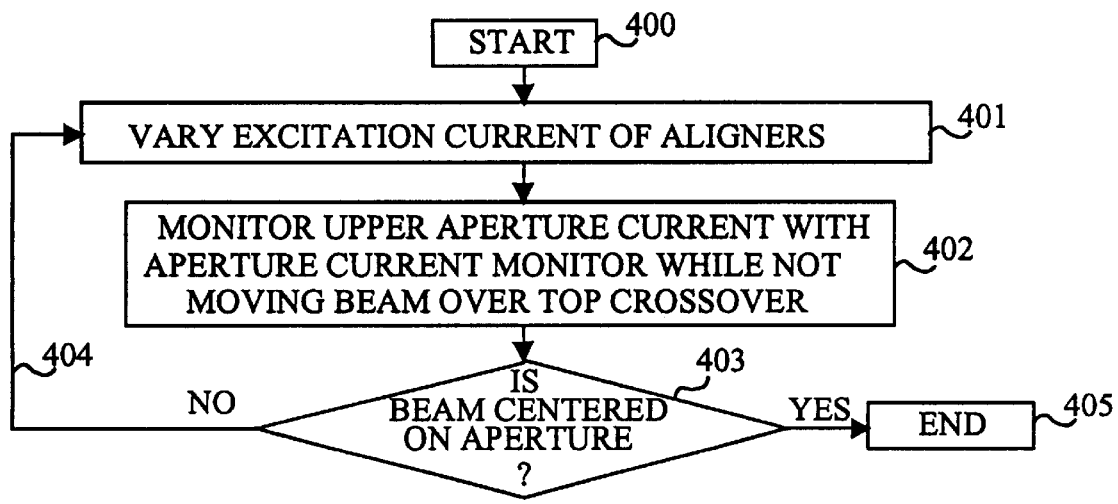
FIG. 10A shows an algorithm for controlling E-beam alignment and centering onto the an aperture which is performed by varying the current to the aligners, by varying of the current through an aperture in FIGS. 3A, 5A, 5B and 5C as adjusted by varying the excitation current of the aligners under control the computer system shown in FIG. 8B.

Referring to the algorithm of FIG. 10A, in accordance with this invention, E-beam alignment and centering onto the composite aperture 10 is done by varying the current on lines 73 to the aligners 22 in FIG. 3A and lines 74/74' in FIGS. 5A and 5C to vary the current through the composite aperture 10 in FIG. 3A or the upper aperture 120/210 in FIGS. 5A/5B as adjusted by varying the excitation current of the aligners 22 or upper aligners 162/243 respectively under control of the computer system 260 shown in FIG. 8B in accordance with the algorithm in FIG. 10A in step 401 thereof.

The aperture current monitors 52 of FIG. 3A (which is illustrative of monitor 130 of FIG. 5A, and monitor 252 of FIG. 5B) are shown in detail in FIG. 8A. Monitor 52 amplifies the signal on line 50 with amplifier 55 and converts the signal in an Analog-to-Digital (A/D) converter 56. The output of A/D converter 56 is supplied on line 53 (which is one of several digital signal input lines 53, 131, 151, 231 and 253) to the CPU 61 of computer system 260 in FIG. 8A. The CPU 61 monitors the composite aperture current on line 53 and after performing the algorithm of FIG. 10A, CPU 61 sends a digital signal on output line 68 to a digital-to-analog (D/A) converter 70 which feeds an analog control signal output to amplifiers 72 which in this case supply an output voltage on line 73 to adjust the current through the upper aligners 22 as required by the computer system 260.

The computer system 260 employs the algorithm shown in FIG. 10A to determine the value of the adjusted current in the upper aligners 22. The CPU continues to perform the algorithm of FIG. 10A until the E-beam 24 is properly aligned as indicated by the voltage on line 53 in FIG. 3A.

Figure 5B:
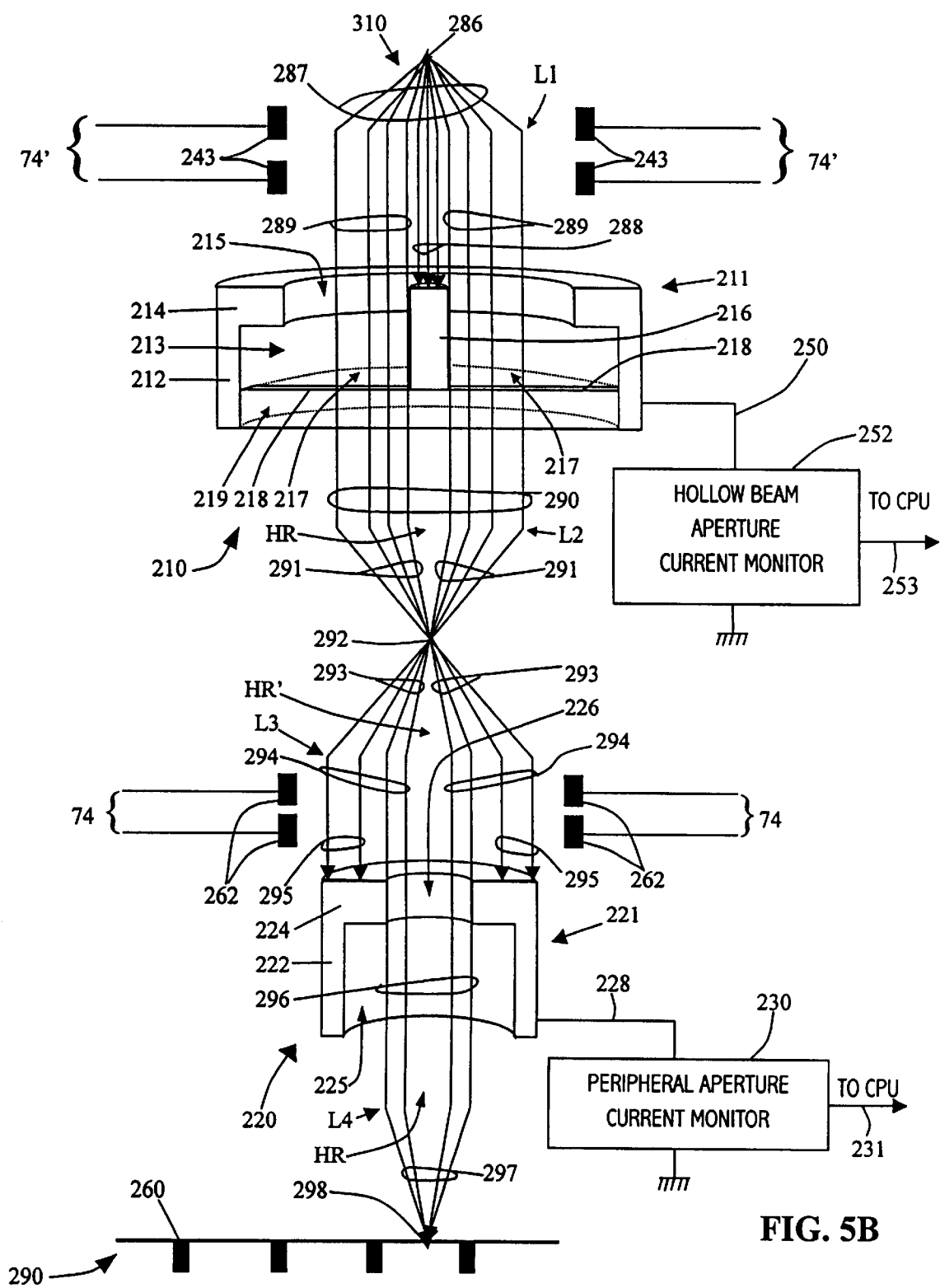
Figure 10B:
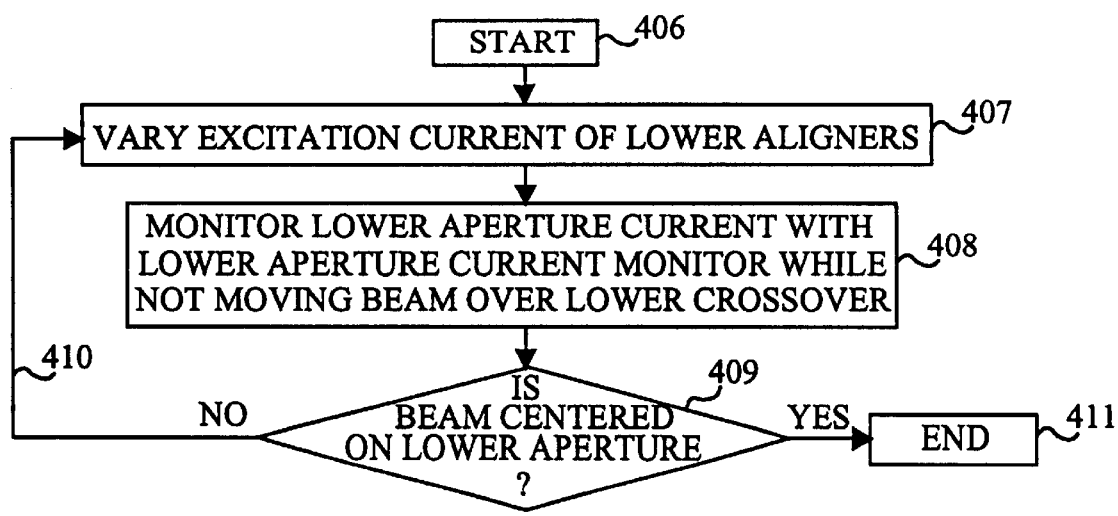
FIG. 10B shows another related algorithm which is employed with the embodiments of FIGS. 5A–5C where there is a lower aperture onto which the E-beam needs to be centered.

FIG. 10B shows another related algorithm which is employed with the embodiments of FIGS. 5A–5C where there is a lower aperture 110/220 onto which the E-beam 194/294 needs to be centered.

Referring to FIG. 8B in conjunction with FIG. 3A, the line 53 from FIG. 3A is connected to one of the IN terminals of the CPU 61 of the process control computer control system 260. As is the usual configuration of a computer system, the CPU 61 is connected to a display monitor 62 and a keyboard 63 as well as a random access memory (RAM) 65 and a Direct Access Storage Device (DASD) which in this case is shown as a disk drive 64 for storing data for the process control computer system 260. A printer 78 is also connected to the CPU. The computer system 260 provides output signals on OUT line 68 to a D/A converter 70 which supplies signals via line 71 to amplifiers 72 which are connected by lines 73 to the upper aligners 22 in FIG. 3A. The CPU 61 generates a scan of the collimated E-beam 24 from left-to-right or right-to-left which produces the curve 87' seen in FIG. 3B which is displayed on the computer display monitor 62 in FIG. 8B. When the collimated E-beam 24 is centered on the composite aperture 10 the curve 87' reaches a maximum.

FIG. 3C shows a curve 96' resulting from passage of collimated E-beam 24 through the composite aperture.

The flow chart of the computer program which is shown in FIG. 10A provides for adjustment of the current in the upper aligners in response to the output of the aperture current monitor 52.

In step 400, the program starts.

Then in step 401 the program generates an incremental digital change which slightly varies the excitation of the upper aperture aligners 22.

In step 402, the program receives the digital value of the aperture current measured by the aperture current monitor 52, while the E-beam position is held constant at the top crossover 21.

In step 403, the CPU tests to determine whether the aperture current indicates that the beam is centered on the upper aperture 15.

If NO, (the beam is not centered on the upper aperture 15) then the program loops back on line 404 to step 401.

If YES, (the beam is centered on the upper aperture 15) then the program ENDs in step 405.

FIG. 10B is a flow chart of a computer program which provides for adjustment of the current in the lower aligners in response to the output of the aperture current monitor 152/230.

In step 406, the program starts.

Then in step 407 the program generates an incremental digital change which slightly varies the excitation of the lower aperture aligners 143/262.

In step 408, the program receives the digital value of the aperture current measured by the lower aperture current monitor 152/230, while the E-beam position is held constant at the lower crossover 192/292.

In step 409, the CPU tests to determine whether the aperture current indicates that the beam is centered on the lower aperture 152/230.

If NO, (the beam is not centered on the lower aperture) then the program loops back on line 410 to step 407.

If YES, (the beam is centered on the lower aperture 110/220 then the program ENDs in step 411.

FIG. 4 is a graph showing an example of monitored aperture current amplitude of the hollow E-beam method of FIG. 3A which is less than the exemplary result desired. As shown in FIG. 4, the peak of the graph expected in monitored aperture current is not very high beneath the arrow, i.e. the contrast between the peak beneath the arrow is not always sufficient to distinguish between the peaks and the valleys with sufficient certainty. Accordingly, I have discovered that since it is difficult to distinguish between optimum alignment and the peripheral alignment values to the left and the right that an alternate embodiment would be desirable to make it less difficult to align the upper E-beam 24 onto the upper aperture 15 with an optimum degree of accuracy by generating curves which are more easily interpreted by the computer system 260 of FIG. 8B than the curve shown in FIG. 4.

Thus, FIGS. 5A and 5B show alternate dual aperture embodiments of several improved methods and apparatus, in accordance with this invention, which are described below. FIG. 5C shows additional details of the embodiment of FIG. 5A.

DUAL APERTURE EMBODIMENTS OF THE INVENTION

FIGS. 5A and 5C are very similar in that a peripheral aperture 120 is located on top and a hollow beam aperture 110 with a center pole 116 is located on the bottom. In FIG. 5B, the reverse configuration is employed with a hollow beam aperture 210 with a center pole 216 is located on the top and a peripheral aperture 220 located on the bottom.

The E-beam projection system 90 of FIGS. 5A and 5C in accordance with this invention consists of the peripheral aperture 120 (on top) which shapes the upper E-beam 187 into a narrower intermediate beam 190/194 and the hollow beam aperture 110 (on the bottom), which shapes the intermediate E-beam 190/194 into a hollow lower E-beam 196/197 which hits the reticle 160 at a focal point 198. For convenience of illustration and initial description of this embodiment, FIG. 5A is less detailed than FIG. 5C, in that it omits the graphs of waveforms which are described later with reference to FIG. 5C.

The upper, peripheral aperture 120 blocks/masks (i.e. defines) the outer periphery 188 of the upper E-beam 187. The lower, hollow beam aperture 110 blocks/masks (i.e. defines) the inner portion 195 of the intermediate E-beam 190/194, thereby producing the hollow lower E-beam 197 which is focussed by lens L4 onto a spot 198 on the workpiece (reticle) 160 which is below the lens L4. In the apparatus shown in FIGS. 5A/5C, the upper, peripheral aperture 120 determines the outer periphery (sets the outer limit) of the upper defined E-beam 190; while the lower aperture 110 determines the inner periphery (sets the inner limit) of the lower defined hollow E-beam 196.

On the other hand, referring to FIG. 5B, the opposite order of arrangement of the two apertures 210/220 also provides a hollow E-beam 290/296 which has the same beam shape. The description which follows immediately below applies specifically to FIG. 5A, but, generally it also applies to FIG. 5B with corresponding reversals in the sequence of the elements and the effects thereof as described below.

Referring again to FIGS. 5A and 5C, before each aperture 110/120, there is a set of aligners 162/143 which are alignment coils. Each set of aligners 162/143 consists of at least two successive alignment coils. The first set of aligners 162 controls the position and the angle of the upper E-beam 187. The second set of aligners 143 controls the position and the angle of the intermediate E-beam 194. Thus the two sets of aligners 162/143 make it possible for the upper E-beam 187 and the intermediate E-beam 194 to be aligned accurately onto the apertures 120/110 below them.

FIG. 5A is a perspective sectional view of a system 90 similar to system 9 of FIG. 3A with two stacked apertures, instead of one, aligned along a single E-beam column. An E-beam 210 generated by a conventional E-beam source (not shown for convenience of illustration) is projected towards an upper crossover 186 where it diverges and then passes through a collimating lens L1 which projects a collimated E-beam 187 consisting of electrons travelling in parallel towards the surface of the top 124 of the peripheral aperture 120 on the top of the E-beam column.

Below the peripheral aperture 120 is a hollow E-beam aperture 110. The two stacked apertures 120/110 substitute for the composite aperture 10 of FIG. 3A. The peripheral aperture 120 acts as a mask blocking the periphery of the collimated beam 187. The hollow beam aperture 110 blocks the center beam 195 of collimated E-beam 194 thereby shaping/patterning the collimated E-beam 194 into a hollow E-beam 196 which passes out of the bottom of the hollow beam aperture 110 and through lens L4 which focuses collimated E-beam 196 as an E-beam 197 onto a spot 198 on workpiece (reticle) 160.

The peripheral aperture 120 comprises an electrically-conductive-metallic shell 121 comprising a hollow metallic cylinder 122 open on the bottom and covered by a metallic top 124. The top 124 has a coaxial, circular, central hole 126 therethrough. The collimated E-beam 187 passes from the peripheral aperture 120 forming a narrower collimated E-beam 190 which is projected through lens L2, forming converging beam 191 which passes through crossover 192 as beam 193 that passes through lens L3 as collimated beam 194 which is projected onto the top of the hollow beam aperture 110.

The hollow beam aperture 110 comprises an electrically-conductive-metallic shell 111 comprising a hollow metallic cylinder 112 open on the bottom and covered by a metallic top 114. Hollow beam aperture 110 includes a top 114 surface which has a coaxial, circular, central hole 115 therethrough. The hollow beam aperture 110 also includes an electrically-conductive-metallic center pole 116 which is suspended coaxially with aperture 110 inside the cylinder 112 and top 114. The upper end of center pole 116 is preferably located inside the central hole 115 aligned coaxially therewith. The central beam 195 which is the central portion of beam 194 is blocked by center pole 116. An annular passageway is provided for the outer portion 196 of beam 194 which comprises a hollow E-beam. Hollow E-beam 196 is shaped by the center pole 116 in lower aperture 110 and the wall of central hole 126 in the upper, peripheral aperture 120 since the center pole 116 is aligned coaxially with the cylinders 122 and 112 and the central holes 126 and 115.

The hollow E-beam 196 passes between the walls of central hole 115 in top 114 and the pole 116. An upper space 113 is defined (inside aperture 110) by the upper side-walls of the cylinder 112, below the top 114 and above a set of radial struts 118 through which the hollow E-beam 196 passes. After the hollow E-beam 196 passes through the upper space 113 it reaches a set of several openings 117 between the struts 118. Openings 117 (indicated between the struts 118 by phantom lines) connect the upper space 113 to a lower space 119 inside the lower side-walls of the cylinder 112 allowing the hollow E-beam 196 to pass therethrough.

Then, the hollow E-beam 196 passes from lower space 119 out of cylinder 112 and through the lens L4 which focuses the collimated E-beam 124 into a converging hollow E-beam 197 which is focused onto a very small spot 198 on a workpiece (reticle) 160.

As indicated above, inside cylinder 112, there are the several, radially-disposed, conductive metallic struts 118, which are electrically and mechanically connected to cylinder 112. Struts 118 are provided to support the center pole 116 and to conduct electrons which are collected thereby towards the electrical output line 150. The struts 118 are secured to the inner wall of the lower end of cylinder 112 (well below the annular top 114) and they are firmly connected to the center pole 116 both mechanically and electrically. The openings 117, between (aside from) the struts 118 permit only the hollow E-beam 196, which (as stated above) is a portion of collimated E-beam 194 to pass therethrough.

As stated above, the central beam 195, i.e. the interior portion, of collimated E-beam 194 from lens L3, strikes the center pole 116 and is masked thereby. The central beam 195 provides a current of electrons which flow through the electrical output line 150 to the hollow beam aperture current monitor 152. Monitor 152 supplies an electrical output current to line 153 to the CPU in FIG. 8B.

To summarize, the peripheral aperture 120 includes upper opening 126 and the peripheral (outer) portion 188 of collimated E-beam 187 strikes the top 124 of shell 121 and is masked thereby. The electrons striking top 124 cause some electrical current to flow through electrical output line 128, and the narrower, collimated E-beam 190 passes out of peripheral aperture 120.

The hollow beam aperture 110 includes an opening 115 between the center pole 116 and the side walls of the central hole in top 114. The hollow E-beam 196 passes through the hole 115 in hollow beam aperture 110 and out below aperture 110 to lens L4.

Ideally, the collimated E-beam 187 is supposed to be centered on the top 124 of the shell 121 and lower, along the column, the collimated E-beam 194 is supposed to be centered on the top 114 of the shell 111.

Since the location (alignment) of the center pole 116 determines the shape and location of the hollow E-beam 196, it is crucial to align a charged particle beam 194 directed onto the top surface of the hollow beam aperture 110 with a high degree of accuracy. Ideally, the collimated E-beam 194 is supposed to be centered on the top 114 of the shell 111 and the center pole 116 of the hollow beam aperture 110. As shown a in FIG. 5C, when the hollow E-beam 196 leaves the hollow beam aperture 110, it is focussed down by lens L4 onto the point 198 on the workpiece (reticle) 160.

A problem that arises is that the E-beam 194 may not be accurately centered on the hollow beam aperture 110, which is a significant fact because of the extremely tight tolerances of submicron devices which means that accuracy of machining in forming and assembling the components of the hollow beam aperture 110 is crucial. I have found that the problem of alignment of E-beams 194 is attributable to machining and assembly errors which affect the location of the upper aperture 115 and the center pole 116 in the hollow beam aperture 110.

The hollow E-beam 196 which passes out of hollow beam aperture 112 is directed therefrom onto a point 198 on a workpiece (reticle) 160.

FIG. 5B is a perspective sectional view similar to FIG. 5A of a system 90' which also includes two stacked apertures aligned along a single E-beam column. On the top of the E-beam column, there is a hollow E-beam aperture 210 and therebelow is a peripheral E-beam aperture 220. The two stacked apertures 210/220 substitute for the apertures 120/110 of FIG. 5A.

In FIG. 5B, an E-beam 310 diverging from an upper crossover 286 passes through a collimating lens L1 thereby projecting a collimated E-beam 287 consisting of electrons travelling in parallel towards the surface of the top of an electrically-conductive-metallic center pole 216.

The upper hollow beam aperture 210 comprises an electrically-conductive-metallic shell 211 comprising a hollow metallic cylinder 212 open on the bottom and covered by a metallic top 214. The top 214 surface has a coaxial, circular, central, hole 215 therethrough. The hollow beam aperture 210 also includes an electrically-conductive-metallic center pole 216 which is suspended coaxially with aperture 210 by struts 218 inside the cylinder 212 and top 214.

The upper end of center pole 216 is preferably located inside the central hole 215 aligned coaxially with cylinder 212 and central hole 215. Center pole 216 blocks the central portion 288 of collimated E-beam 287 while the hollow E-beam 290 (the outer portion 290 of beam 287) passes through an annular hole/passageway provided by the central hole 215 and the center pole 216 in the hollow beam aperture 210. In summary, the hollow E-beam 290 was shaped by the center pole 216 in the hollow beam aperture 210.

Since the location (alignment) of the center pole 216 determines the shape and location of the hollow E-beam 290, it is crucial to align a charged particle beam 287 directed onto the top surface of the hollow beam aperture 215 with a high degree of accuracy. Ideally, the collimated E-beam 287 is supposed to be centered on the top 214 of the shell 211 and the center pole 216 of the hollow beam aperture 215.

As indicated above, inside cylinder 212, there are the several, radially-disposed, conductive metallic struts 218, which are electrically and mechanically connected to cylinder 212. Struts 218 are provided to support the center pole 216 and to conduct electrons which are collected thereby towards the electrical output line 250. The struts 218 are secured to the inner wall of the lower end of cylinder 212 (well below the annular top 214) and they are firmly connected to the center pole 216 both mechanically and electrically. The openings 217, between (aside from) the struts 218 permit only the hollow E-beam 290, which (as stated above) is a portion of collimated E-beam 287 to pass therethrough towards lenses L2, L3 and peripheral shell 221.

The collimated, hollow E-beam 290 passes from the hollow beam aperture 210 as a collimated hollow E-beam which is projected through lens L2, forming converging hollow E-beam 291 which passes through crossover 292 as E-beam 293 that passes through lens L3 as hollow, collimated E-beam 294 which is projected onto the top of the peripheral aperture 220.

The peripheral aperture 220 comprises an electrically-conductive-metallic shell 221 comprising a hollow metallic cylinder 222 defining a hollow space 225 that is open on the bottom and covered by a metallic top 224. The top 224 has a coaxial, circular, central hole 226 therethrough.

The peripheral aperture 220 acts as a mask blocking the periphery of the collimated hollow E-beam 294. The peripheral aperture 220 blocks the periphery of collimated E-beam 294 thereby shaping/patterning the collimated E-beam 294 into a narrower hollow E-beam 296. In other words, the central portion 296 of the hollow E-beam 296 passes between the walls of central hole 226 in top 224, while the peripheral portions of E-beam 296 are blocked by the metallic top 224.

The narrower hollow E-beam 296 passes out of the bottom of the peripheral aperture 220 and through lens L4 which focuses collimated E-beam 296 into a converging hollow E-beam 297 that is focused onto a very small a spot 298 on a workpiece (reticle) 260.

As stated above, the peripheral portion 295 (the outer portion) of collimated E-beam 294 from lens L3 strikes the 224 and is masked thereby. The peripheral beam 295 provides a current of electrons which flow through the electrical output line 228 to the hollow beam aperture current monitor 230. Monitor 230 supplies an electrical output current to line 231 to the CPU in FIG. 8B.

To summarize, the lower, peripheral aperture 220 includes an upper opening 226 and the peripheral (outer) portion 295 of collimated E-beam 294 strikes the top 224 of shell 221 and is masked thereby and the electrons striking the top 224 cause some electrical current to flow through electrical output line 228, and the inner E-beam 296 portion of collimated E-beam 294 passes through the lower, peripheral aperture 220.

The lower aperture 220 includes an opening 225 between the side walls of the peripheral shell 221. The hollow E-beam 296 passes through the lower aperture 220. Ideally, the collimated E-beam 296 is supposed to be centered on the top 124 of the shell 121 and lower, along the column, the collimated E-beam 194 is supposed to be centered on the top 224 of the shell 221.

As shown in FIG. 5B, when the hollow E-beam 296 leaves the hollow beam aperture 220, it is focussed down by lens L4 as beam 297 onto the point 298 on the workpiece (reticle) 260. The problem that arises is that E-beam 294 may not be accurately centered on hollow beam aperture 220, which is a significant fact because of the extremely tight tolerances of submicron devices which means that accuracy of machining in forming and assembling the components of the hollow beam aperture 210 is crucial.

I have found that the problem of alignment of E-beams 194 is attributable to machining and assembly errors which affect the location of the upper aperture 215 and center pole 216 in hollow beam aperture 210. The hollow E-beam 196 which passes out of the hollow beam aperture 210 is directed therefrom through peripheral aperture 220 onto the point 298 on the workpiece (reticle) 260.

E-beam alignment and centering onto each aperture 210/220 is accomplished by monitoring current through the respective apertures with the monitors 130/152 which are shown in FIGS. 5A and 5C. Similarly, referring again to the embodiment in FIG. 5B, E-beam alignment and centering onto each aperture 210/220 is accomplished by monitoring current through the respective apertures with the monitors 252/230.

MONITORING OF APERTURE CURRENT

Monitoring of aperture current will be discussed with reference to FIGS. 5A, 5C and FIGS. 5D–5F.

FIG. 5D is a graph which shows an example of the bell shaped curve 187' of current in upper E-beam 187.

FIG. 5E is a graph which shows an example of the narrowed aperture current profile 190' of the intermediate E-beam 190 monitored inside the hollow cylinder 121 in the lower portion of the upper, peripheral aperture 120 of FIGS. 5A and 5C.

FIG. 5F is a graph which shows the hollow E-beam profile 196' of the lower aperture current of E-beam 196 monitored in the lower aperture 110 in FIG. 5C. By controlling the deflection of the upper E-beam 187 to "minimize" the monitored current intercepted by the upper, peripheral aperture 120 and at the same time by controlling the deflection of the intermediate E-beam 194 to "maximize" monitored current intercepted by the lower aperture 110, we can align and center the beams 187/194 onto apertures 120/110.

An important goal in this invention, which is that a portion of the charged particle beam should hit the center pole 116 of the second aperture 110, but should not hit the top 114 of the metallic shell 111, i.e. the peripheral portion of the lower, hollow beam aperture 110. If that goal is met, we get a very good peak in monitored aperture current (good contrast) in each of the apertures 120/110. We can independently control the beam position on apertures 120/110, i.e. we can control alignment of the inner periphery and the outer periphery of the E-beam 187/194 by using the corresponding set of aligners 162 or 143 with certain high accuracy.

Referring to FIG. 8B in conjunction with FIGS. 5A/5C lines 131/153 from FIG. 5A are connected to IN terminals of the CPU 61 of the process control computer control system 60. The computer system 260 provides output signals on OUT lines 74/74' to a D/A converter 70 which supplies signals via line 71 to amplifiers 72 which are connected by lines 73 to the upper aligners 22 in FIG. 3A.

Figure 6:
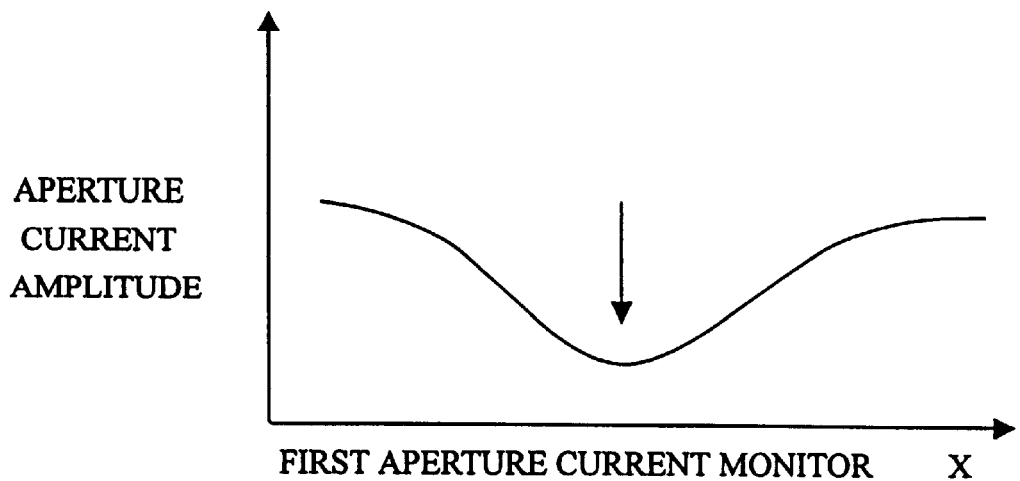
FIG. 6 shows a graph of "aperture current amplitude" of current received by the peripheral aperture current monitor of FIGS. 5A/5C as the E-beam is scanned across the upper, peripheral aperture with a minimum value when the E-beam is centered over the upper, peripheral aperture.

FIG. 6 shows a graph of "aperture current amplitude" of current received by the peripheral aperture current monitor 130 of FIGS. 5A/5C as the E-beam 187 is scanned across the upper, peripheral aperture 120 with a minimum value when the E-beam 187 is centered over the aperture 120.

Figure 7:
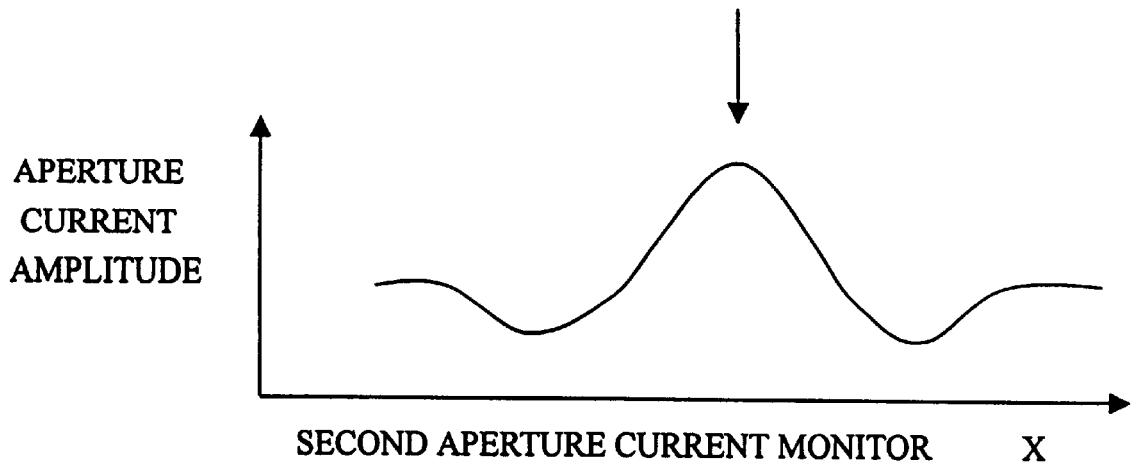
FIG. 7 shows a graph of "aperture current amplitude" of current received by an aperture current monitor of FIGS. 5A/5C an intermediate E-beam is scanned across a hollow beam aperture, with a very clear maximum value when the E-beam is centered over the hollow beam aperture.

FIG. 7 shows a graph of "aperture current amplitude" at the second aperture current monitor 152 of FIGS. 5A/5C as intermediate E-beam 194 is scanned from across the second, hollow beam aperture 110, with a very clear maximum value when the E-beam 194 is centered over aperture 110.

Figure 9A:
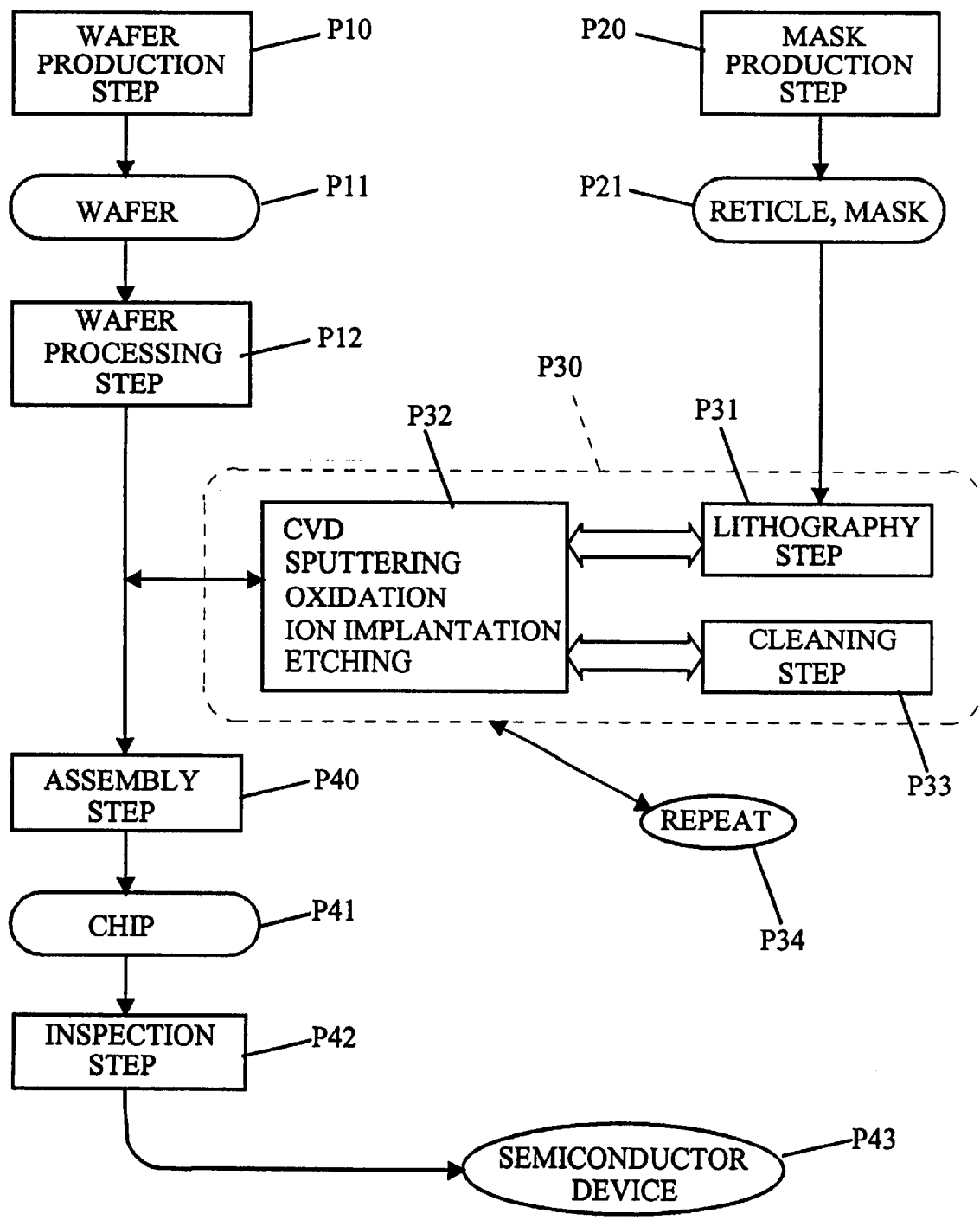
FIG. 9A shows a schematic block diagram of a process for manufacture of a semiconductor chip adapted to employing the apparatus and the method of this invention.

FIG. 9A shows a block diagram of a process for producing a semiconductor chip adapted to employing the apparatus and method of this invention. The semiconductor fabrication method of FIG. 9A comprises mainly a wafer production step P10 (or wafer preparation step) which produces a finished wafer in step P11, a mask production step P20 (or mask preparation step) which produces a finished reticle, mask in step P21, a wafer processing step P12, an assembly step P40 yielding a chip P41 and an inspection step P42. Each step comprises several substeps as will be well understood by those skilled in the art. Among these main steps, the wafer processing step P12 is a most important step to achieve the specified finest pattern width and registration limit. In this step, the designed circuit patterns are stacked successively on the wafer from step P11 and many operative semiconductor chips like memory devices are formed on the wafer from step P11.

The wafer processing steps P12 comprises a step of thin film formation wherein a dielectric layer for insulation is formed or a metallic layer for lead lines and for electrodes is formed. An oxidization step can be employed to oxidize the thin film or the wafer substrate. A lithography step P31 involves use of the reticle/mask P21 to form a photoresist or other resist pattern to process the thin film or wafer substrate selectively, a selected set of process steps P32 including etching the thin film or wafer substrate and implanting ions or impurities into the thin film or wafer substrate using the resist pattern from step P31 as a mask. There is the conventional resist stripping step to remove the resist from the wafer and chip inspection step. As indicated at P34, the wafer processing steps P30 are repeated as many times as necessary to make a semiconductor chip be operable as designed, as will be understood by those skilled in the art.

Figure 9B:
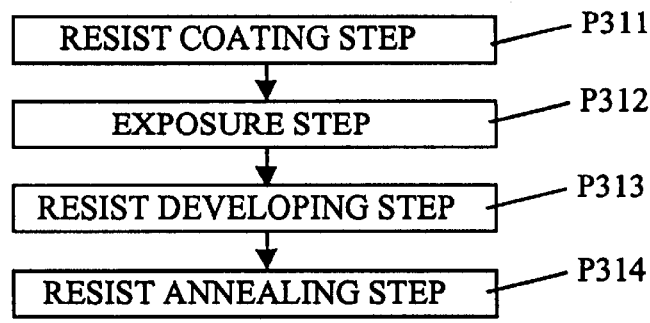
FIG. 9B shows a flow chart of lithography steps of FIG. 9A which are dominant steps in the wafer processing steps of this invention.

FIG. 9B shows a flow chart of lithography steps P31 of FIG. 9A which are dominant steps in the wafer processing steps P12/P30 adapted for employment with the method and apparatus of this invention. Lithography steps P31 comprise a resist-coat step P311 in which the wafer substrate is coated with resist on circuit elements formed in a previous steps. An exposure step P312 then exposes the wafer coated with resist through the reticle/mask of step P21 employing a deflector in accordance with this invention. A resist development step P313 follows for developing the resist exposed in exposure step P312 followed by a resist annealing step P314 performed to enhance durability of the resist pattern produced in step P313.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of aligning a charged particle beam with an aperture including:

providing a charged particle beam, providing a hollow beam aperture means adapted for shaping a charged particle beam into a hollow charged particle beam, directing the charged particle beam through the aperture means, providing deflection coils for deflecting the charged particle beam relative to the aperture, varying the current to the alignment deflection coils, measuring the aperture electrical current generated by charged particles reaching the hollow beam aperture as a function of the current to the alignment deflection coils, and adjusting the current in the alignment deflection coils based on the aperture electrical current to center the charged particle beam on the hollow beam aperture.

2. The method of claim 1 including measuring the aperture electrical current to the hollow beam aperture means with an aperture current monitor and providing a scan of the aperture electrical current.

3. The method of claim 2 including providing a central pole suspended in the hollow beam aperture means.

4. The method of claim 1 including:

providing a central pole suspended in the hollow beam aperture means, measuring the aperture electrical current to the hollow beam aperture means including the central pole with an aperture current monitor and providing a scan of the aperture current.

5. The method of claim 1 including:

providing a peripheral aperture means with a large aperture for shaping the periphery of the charged particle beam, measuring the aperture electrical current generated by charged particles reaching the peripheral beam aperture as a function of the current to the alignment deflection coils, and adjusting the current in the peripheral beam alignment deflection coils based on the peripheral beam aperture electrical current to center the charged particle beam on the peripheral beam aperture.

6. The method of claim 1 including:

providing a peripheral aperture means with a large aperture for shaping the periphery of the charged particle beam, providing a central pole suspended in the hollow beam aperture means, measuring the aperture electrical current generated by charged particles reaching the peripheral beam aperture as a function of the current to the peripheral aperture alignment deflection coils, and adjusting the current in the alignment deflection coils based on the peripheral beam aperture electrical current to center the charged particle beam on the peripheral beam aperture.

7. The method of claim 1 including:

providing a peripheral aperture means with a large aperture for shaping the periphery of the charged particle beam above the hollow beam aperture means, providing a central pole suspended in the hollow beam aperture means, measuring the aperture electrical current generated by charged particles reaching the peripheral beam aperture as a function of the current to peripheral beam aperture alignment deflection coils, adjusting the current in peripheral beam alignment deflection coils based on the peripheral beam aperture electrical current to center the charged particle beam on the peripheral beam aperture, measuring the aperture electrical current generated by charged particles reaching the hollow beam aperture as a function of the current to hollow beam alignment deflection coils, and adjusting the current in the hollow beam alignment deflection coils based on the hollow beam aperture electrical current to center the charged particle beam on the hollow beam aperture.

8. A method of aligning an E-beam with an aperture including:

providing an E-beam, providing a shaping aperture means adapted for shaping an E-beam into a hollow E-beam, directing the E-beam through the shaping aperture means, providing deflection coils for deflecting the E-beam relative to the shaping aperture, varying the current to the alignment deflection coils, measuring the electrical current generated by electrons from the E-beam reaching the shaping aperture as a function of the current to the alignment deflection coils, and setting the current in the alignment deflection coils, to center the E-beam on the shaping aperture.

9. The method of claim 8 including measuring the aperture electrical current to the hollow beam aperture means with an aperture current monitor and providing a scan of the aperture electrical current.

10. The method of claim 9 including providing a central pole suspended in the hollow beam aperture means.

11. The method of claim 8 including:

providing a central pole suspended in the hollow beam aperture means, and measuring the aperture electrical current to the hollow beam aperture means including the central pole with an aperture current monitor and providing a scan of the aperture current.

12. The method of claim 8 including:

providing a peripheral aperture means with a large aperture for shaping the periphery of the E-beam, measuring the aperture electrical current generated by electrons reaching the peripheral beam aperture as a function of the current to the alignment deflection coils, and adjusting the current in the peripheral beam alignment deflection coils based on the peripheral beam aperture electrical current to center the E-beam on the peripheral beam aperture.

13. The method of claim 8 including:

providing a peripheral aperture means with a large aperture for shaping the periphery of the E-beam, providing a central pole suspended in the hollow beam aperture means, measuring the aperture electrical current generated by electrons reaching the peripheral beam aperture as a function of the current to the peripheral aperture alignment deflection coils, and adjusting the current in the alignment deflection coils based on the peripheral beam aperture electrical current to center the E-beam on the peripheral beam aperture.

14. The method of claim 8 including:

providing a peripheral aperture means with a large aperture for shaping the periphery of the E-beam above the hollow beam aperture means, providing a central pole suspended in the hollow beam aperture means, measuring the aperture electrical current generated by electrons reaching the peripheral beam aperture as a function of the current to peripheral beam aperture alignment deflection coils, adjusting the current in peripheral beam alignment deflection coils based on the peripheral beam aperture electrical current to center the E-beam on the peripheral beam aperture, measuring the aperture electrical current generated by electrons reaching the hollow beam aperture as a function of the current to hollow beam alignment deflection coils, and adjusting the current in the hollow beam alignment deflection coils based on the hollow beam aperture electrical current to center the E-beam on the hollow beam aperture.

15. Apparatus for aligning a charged particle beam comprising:

a hollow beam aperture means adapted for shaping a charged particle beam into a hollow charged particle beam, beam means producing a charged particle beam directed through the aperture means, deflection coils for deflecting the charged particle beam relative to the aperture, deflection current means for varying the current to the alignment deflection coils, measurement means for measuring the aperture electrical current generated by charged particles reaching the hollow beam aperture as a function of the current to the alignment deflection coils, and adjustment means for adjusting the current in the alignment deflection coils based on the aperture electrical current to center the charged particle beam on the hollow beam aperture.

16. The apparatus of claim 15 including measurement means for measuring the aperture electrical current to the hollow beam aperture means with an aperture current monitor and providing a scan of the aperture electrical current.

17. The apparatus of clam 15 including a central pole suspended in the hollow beam aperture means.

18. The apparatus of claim 15 including:

a central pole suspended in the hollow beam aperture means, and measurement means for measuring the aperture electrical current to the hollow beam aperture means including the central pole with an aperture current monitor and providing a scan of the aperture current.

19. The apparatus of claim 15 including:

a peripheral aperture means with a large aperture for shaping the periphery of the charged particle beam, measurement means for measuring the aperture electrical current generated by charged particles reaching the peripheral beam aperture as a function of the current to the alignment deflection coils, and adjustment means for adjusting the current in the peripheral beam alignment deflection coils based on the peripheral beam aperture electrical current into center the charged particle beam on the peripheral beam aperture.

20. The apparatus of claim 15 including:

a peripheral aperture means with a large aperture for shaping the periphery of the charged particle beam, a central pole suspended in the hollow beam aperture means, measurement means for measuring the aperture electrical current generated by charged particles reaching the peripheral beam aperture as a function of the current to the peripheral aperture alignment deflection coils, and adjusting means for adjusting the current in the alignment deflection coils based on the peripheral beam aperture electrical current to center the charged particle beam on the peripheral beam aperture.

21. The apparatus of claim 15 including:

a peripheral aperture means with a large aperture for shaping the periphery of the charged particle beam above the hollow beam aperture means, a central pole suspended in the hollow beam aperture means, measurement means for measuring the aperture electrical current generated by charged particles reaching the peripheral beam aperture as a function of the current to peripheral beam aperture alignment deflection coils, adjusting means for adjusting the current in peripheral beam is alignment deflection coils based on the peripheral beam aperture electrical current to center the charged particle beam on the peripheral beam aperture, measurement means for measuring the aperture electrical current generated by charged particles reaching the hollow beam aperture as a function of the current to hollow beam alignment deflection coils, and adjusting means for adjusting the current in the hollow beam alignment deflection coils based on the hollow beam aperture electrical current to center the charged particle beam on the hollow beam aperture.

22. Apparatus for aligning a E-beam comprising:

a hollow beam aperture means adapted for shaping a E-beam into a hollow E-beam, beam means producing a E-beam directed through the aperture means, deflection coils for deflecting the E-beam relative to the aperture, deflection current means for varying the current to the alignment deflection coils, measurement means for measuring the aperture electrical current generated by electrons reaching the hollow beam aperture as a function of the current to the alignment deflection coils, and adjustment means for adjusting the current in the alignment deflection coils based on the aperture electrical current to center the E-beam on the hollow beam aperture.

23. The apparatus of claim 22 including measurement means for measuring the aperture electrical current to the hollow beam aperture means with an aperture current monitor and providing a scan of the aperture electrical current.

24. The apparatus of claim 23 including a central pole suspended in the hollow beam aperture means.

25. The apparatus of claim 22 including:

a central pole suspended in the hollow beam aperture means; and measurement means for measuring the aperture electrical current to the hollow beam aperture means including the central pole with an aperture current monitor and providing a scan of the aperture current.

26. The apparatus of claim 22 including:

a peripheral aperture means with a large aperture for shaping the periphery of the E-beam, measurement means for measuring the aperture electrical current generated by electrons reaching the peripheral beam aperture as a function of the current to the alignment deflection coils, and adjustment means for adjusting the current in the peripheral beam alignment deflection coils based on the peripheral beam aperture electrical current to center the E-beam on the peripheral beam aperture.

27. The apparatus of claim 22 including:

a peripheral aperture means with a large aperture for shaping the periphery of the E-beam, a central pole suspended in the hollow beam aperture means, measurement means for measuring the aperture electrical current generated by electrons reaching the peripheral beam aperture as a function of the current to the peripheral aperture alignment deflection coils, and adjusting means for adjusting the current in the alignment deflection coils based on the peripheral beam aperture electrical current to center the E-beam on the peripheral beam aperture.

28. The apparatus of claim 22 including:

a peripheral aperture means with a large aperture for shaping the periphery of the E-beam above the hollow beam aperture means, a central pole suspended in the hollow beam aperture means, measurement means for measuring the aperture electrical current generated by electrons reaching the peripheral beam aperture as a function of the current to peripheral beam aperture alignment deflection coils, adjusting means for adjusting the current in peripheral beam alignment deflection coils based on the peripheral beam aperture electrical current to center the E-beam on the peripheral beam aperture, measurement means for measuring the aperture electrical current generated by electrons reaching the hollow beam aperture as a function of the current to hollow beam alignment deflection coils, and adjusting means for adjusting the current in the hollow beam alignment deflection coils based on the hollow beam aperture electrical current to center the E-beam on the hollow beam aperture.

* * * * *